United States Patent [19]

Beer

[11] Patent Number: 4,703,276

[45] Date of Patent: Oct. 27, 1987

[54] PERMANENT MAGNET RING ASSEMBLY FOR NMR IMAGING SYSTEM AND METHOD FOR USING SUCH ASSEMBLY

[75] Inventor: Steve Beer, Burlington, Mass.

[73] Assignee: Elscint Ltd., Haifa, Israel

[21] Appl. No.: 726,611

[22] Filed: Apr. 24, 1985

[51] Int. Cl.$^4$ .......................................... G01R 33/20
[52] U.S. Cl. .................................. 324/319; 335/306
[58] Field of Search ...................... 324/319, 320, 309; 335/210, 212, 302, 306

[56] References Cited

U.S. PATENT DOCUMENTS

| | | |
|---|---|---|
| 2,981,871 | 4/1961 | Westmijze . |
| 3,205,415 | 9/1965 | Seki et al. . |
| 3,227,931 | 1/1966 | Adler . |
| 3,847,141 | 11/1974 | Hoop ................................. 128/660 |
| 4,355,236 | 10/1982 | Holsinger . |

OTHER PUBLICATIONS

Double, G. P. et al., "Collor to Mechanically Adjust Pole–Foce Parallelism", IBM Tech. Disclosure Bulletin, vol. 18, #1, Jun. 1975.
K. Halbach, "Design of Permanent Multipole Magnets with Oriented Rare Earth Cobalt Material", Nuclear Instruments and Methods, vol. 169 (1980), pp. 1–10.
R. L. Gluckstern & R. F. Holsinger, "Design of REC Permanent Magnet Quadrapoles Taking Into Account B,H Non–Linearity", publication and date of publication not presently known.
R. F. Holsinger & K. Halbach, "A New Generation of Samarium Cobalt Quadrapole Magnets for Particle Beam Focusing Applications", Paper No. II-1 at Fourth International Workshop on Rare Earth Cobalt Permanent Magnets, Hakone National Park, Japan, May 22–24, 1979.
D. R. F. Holsinger, "Rare Earth Cobalt Magnets Assemblies for Charged Particle Beams", paper no. II-3 at the VI International Workshop on Rare Earth Cobalt Permanent Magnets, Baden/Vienna, Austria, Aug. 31–Sep. 3, 1982.
K. Halbach, "Physical and Optical Properties of Rare Earth Cobalt Magnets", Nuclear Instruments and Methods, vol. 187 (1981), pp. 109–117.
R. D. Hay & C. G. Masi, "A Variable Strength Permanent Magnet Dipole", publication and date unknown.
A. N. Gerbert, S. B. Mukho, Y. D. Rabinovich & V. S. Skachkov, "Quadrapole Lens With Poles of Implicit Form Based on Permanent Magnets", Instruments and Exp. Tech, vol. 13, No. 1 (Jan.–Feb., 1980).
N. V. Lazarev & V. S. Skachkov, "The Tipless Permanent Magnet Quadrapole Lenses", paper apparently presented At Berkley, CA in 1979.

*Primary Examiner*—Michael J. Tokar
*Assistant Examiner*—Francis J. Jaworski
*Attorney, Agent, or Firm*—Sandler & Greenblum

[57] ABSTRACT

An NMR imaging system includes apparatus for producing a uniform magnetic field in a predetermined volume. Such apparatus includes a ring assembly having an axial extent L defined by a plurality of nonmagnetic rings, each having an axis and positioned side-by-side so that the axes of the rings are colinear and define the axis of the ring assembly. A plurality of discrete permanent magnet segments are angularly mounted within each ring for defining a central coaxial aperture. Each segment in a ring has a easy axis of magnetization whose orientation is functionally related to the angular position of the segment in the ring. Each segment has inner and outer edges that are nominally located at distances $r_1$ and $r_2$, respectively, from the axis of the ring from which it is mounted. The inner free ends of the segments of all of the rings define a central aperture of length L within the ring assembly. Finally, an adjustment is provided for moving the segments in each ring such that the distance $r_1$ and $r_2$ of each segment are non-uniformly, but functionally related to the axial extent L of the assembly.

10 Claims, 4 Drawing Figures

PERMANENT MAGNET RING ASSEMBLY FOR NMR IMAGING SYSTEM AND METHOD FOR USING SUCH ASSEMBLY

FIELD OF THE INVENTION

This invention relates to a permanent magnet ring assembly for an NMR imaging system, and to a method for using such assembly to establish a uniform magnetic field in an imaging sphere within the assembly.

BACKGROUND OF THE INVENTION

Nuclear magnetic resonance (NMR) diagnostic imaging systems are based on nuclear phenomena which occur when atomic nuclei located in a static, uniform magnetic field, are stimulated by a second magnetic field rotating at the Larmor frequency associated with particular nuclei. Upon removal of the rotating stimulation field, the stimulated nuclei relax and emit the absorbed energy in the form of radio frequency signals, termed NMR signals, which are received and processed to provide a visible display of the nuclei.

As essential requirement in NMR imaging is obtaining a uniform magnetic field in a region termed the "imaging sphere". It is within this sphere that a medically significant portion of a patient is positioned for the purpose of obtaining an NMR image of such portion. Typically, a suitable uniform magnetic field is obtained using large electromagnets that require cooling the current carrying conductors with liquid helium to a temperature near absolute zero. The cooling required with conventional electromagnetics contribute to the expense and complexity of an NMR installation.

The use of permanent magnets would greatly simplify installation and operation of an NMR installation; but the problem is how to establish a field of the necessary strength and uniformity within the image sphere. An article by K. Halback entitled "Design of Permanent Magnet Multipole Magnets with Oriented Rare Earth Cobalt Materials" appearing in the *Nuclear Instruments and Methods* (Vol. 169, p. 1-10, 1980), hereinafter referred to as Reference [1], provides important information in terms of materials and geometry for a first step in substituting a permanent magnet for a conventional electromagnet in NMR imaging device.

In the article, the author describes rare earth cobalt (REC) material whose properties approach those of an ideal magnet: permeability of unity and zero susceptibility. REC material, and to a lesser extent the ferrites, are magnetically hard, have a high coercivity, and thus resist external magnetic influences. The author applies REC material to the design of multipole magnets, and particularly quadrapoles for use in beam optics (i.e., the technology by which particle beams are focused) and discusses the theory by which mutlipole permanent magnets can be designed. Thus, the article derives the relationship between the easy axis of magnetization in an infinitely long cylinder of material having perfect magnetic properties and having an axial aperture, and the field within such aperture.

While the author is interested in quadrapoles, it is clear that a dipole magnet (which produces a uniform transverse field within the aperture) would be one in which the angular variation of the easy axis is $2\theta$. That is to say at $0°$, the easy axis of magnetization would be $0°$; at $45°$, th easy axis orientation would be $90°$, etc. The relationship set forth in Reference [1] requires perfect magnetic material, a continuous variation in easy axis orientation as a function of angle, and an infinite axial extent. In such an arrangement, it can be shown that the field $B_0$ inside an aperture of radius $r_1$ in an infinitely long cylinder of outer radius $r_2$ is $B_r[\ln(r_2/r_1)]$ where $B_r$ is termed the remanent magnetization. The field outside the cylinder is zero.

Reference [1] also applies these theoretical principles to real materials wherein the intrinsic coercivity is finite such that the magnetization of the material is affected by external fields, the material is not homogeneous, the easy axis of magnetization is a discrete rather than a continuous function of $\theta$, and the axial extent is finite. As a consequence of these practical limitations on both material and geometry, the author of Reference [1] finds that distortions in the ideal field are introduced by using a magnet composed of a plurality of segments, each having a fixed easy axis of magnetization throughout. Specifically, the author shows that the introduced distortion is harmonic with spatial frequencies proportional to the number of discrete segments, and shows that properly spacing the segments can remove the fundamental from the distortion.

Reference [1] also discusses the fringe fields that develop at the end of multipole magnets by reason of their finite length. Essentially, the author takes the position that a magnet of finite length can be analyzed as two semifinite lengths of opposite sign.

The problem with directly applying the teachings of Reference [1] to the problem of obtaining a dipole field for an NMR imaging system is field nonuniformity. The field within a sphere at the center of a cylindrical magnet of reasonable length constructed in accordance with Reference [1] is not sufficiently uniform for NMR imaging even when conventional shimming coils are employed. Therefore, an object of the present invention is to improve the field uniformity within a predetermined region in a cylindrical permanent magnet arrangement.

BRIEF DESCRIPTION OF THE INVENTION

Apparatus according to the present invention produces a homogeneous magnetic field in a predetermined volume in a NMR imaging system by reason of employing a ring assembly having an axial extent L defined by a plurality of nonmagnetic rings, each ring having an axis and positioned side-by-side so that the axes of the rings are colinear and define the axis of the ring assembly. A plurality of discrete, permanent magnet segments are angularly mounted within each ring for defining a central coaxial aperture. Each segment in a ring has an easy axis of magnetization whose orientation is functionally related to the angular position of the segment in the ring. Each segment has inner and outer free ends that are nominally located at distances $r_1$ and $r_2$, respectively, from the axis of the ring within which it is mounted. The inner free ends of the segments of all the rings define a central aperture of length L within the ring assembly. Finally, the segments are mounted in each ring such that the distance $r_1$ and $r_2$ of each segment are nonuniformly, but functionally, related to the axial extent L of the assembly.

Preferably, the segments are mounted in each ring in such a way as to effect independent radial adjustment of the segments. With this arrangement, the central rings define an imaging sphere within which the field can be made very uniform. Uniformity is achieved by an iterative procedure that begins with positioning the segments radially in each ring at positions which can be calculated based on assuming that the magnetic material is perfect, and that the easy axis of magnetization varies continuously to produce a dipole field. The field strength within the imaging sphere is measured, and the radial positions of the segments on the various rings between the central rings and the axial end rings are adjusted to improve the uniformity of the field strength in the imaging sphere. By an iterative process, the adjustments are continued until the desired degree of uniformity is achieved.

In the preferred embodiment of the invention, the quantity $r_2-r_1$ of each ring is constant for all the rings between the two rings that form the end rings in the assembly. Preferably, the quantity $r_2-r_1$ for the end rings differs from the quantity of $r_2-r_1$ for rings intermediate the end rings. Specifically, the quantity $\ln(r2/r1)$ of the end rings is greater than the quantity $\ln(r2/r1)$ of the rings intermediate the end rings.

In order to provide for the radial movement of the magnetic segments, each segment has a nonmagnetic bar bonded on an edge thereof, and guide means are cooperable with the ring on which the segment is mounted for effecting radial displacement of the segment relative to the ring. The axial position of the segment is established, preferably, by rotationally adjusting a screw thread arrangement cooperating with the ring and the nonmagnetic bar bonded to the segment.

BRIEF DESCRIPTION OF THE DRAWINGS

An embodiment of the present invention is disclosed in the accompanying drawings wherein.

DETAILED DESCRIPTION

Figure 1:
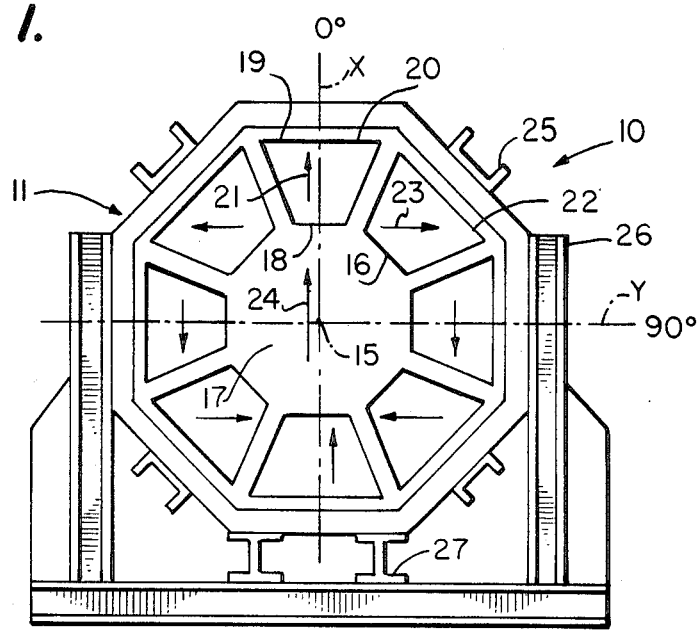
FIG. 1 is a schematic end view of apparatus according to the present invention for providing a homogeneous magnetic field.
Figure 2:
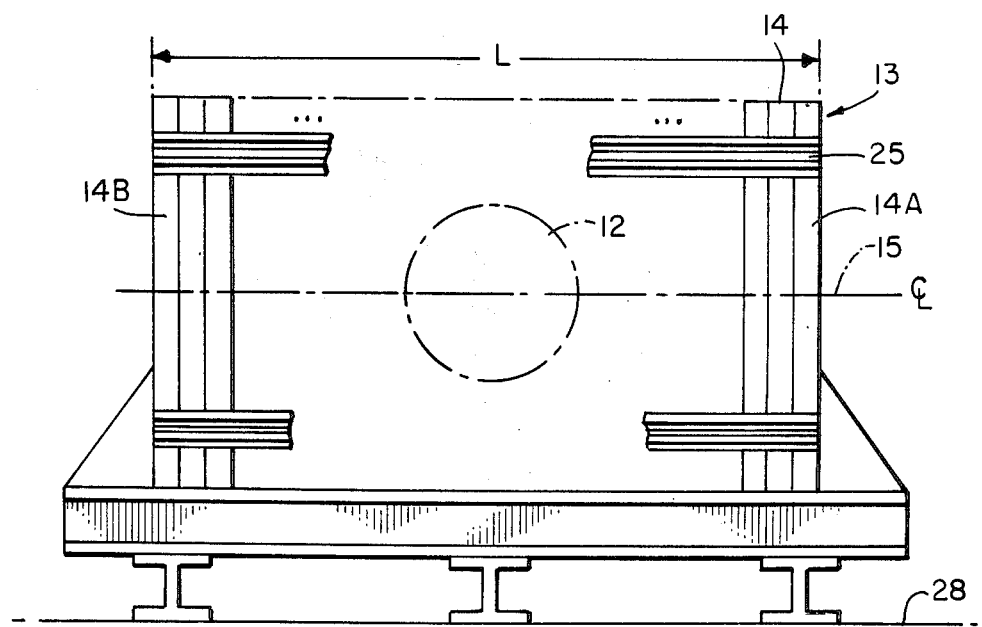
FIG. 2 is a side view of the apparatus shown in FIG. 1.

Referring now to FIG. 1, reference 10 designates an NMR imaging system according to the present invention including apparatus 11 for producing a homogeneous magnetic field in a centrally located predetermined volume, termed imaging volume 12 (FIG. 2). An NMR imaging system includes an antenna for transmitting RF signals that excite a sample located in volume 12, and a receiving antenna for receiving NMR signals from the sample, as well as data processing and display means for converting the received signals into a visible display. This associated equipment, which is conventional, is not shown in the drawing for simplification, and in order to emphasize that the present invention lies in apparatus 11.

Ring assembly 13, which is a part of apparatus 11 has axial extent L and includes a plurality of non-magnetic rings 14 each having an axis, and positioned side-by-side as shown in FIG. 2, so that the axes of the rings are colinear and define central, longitudinal axis 15 of ring assembly 13.

Figure 4:
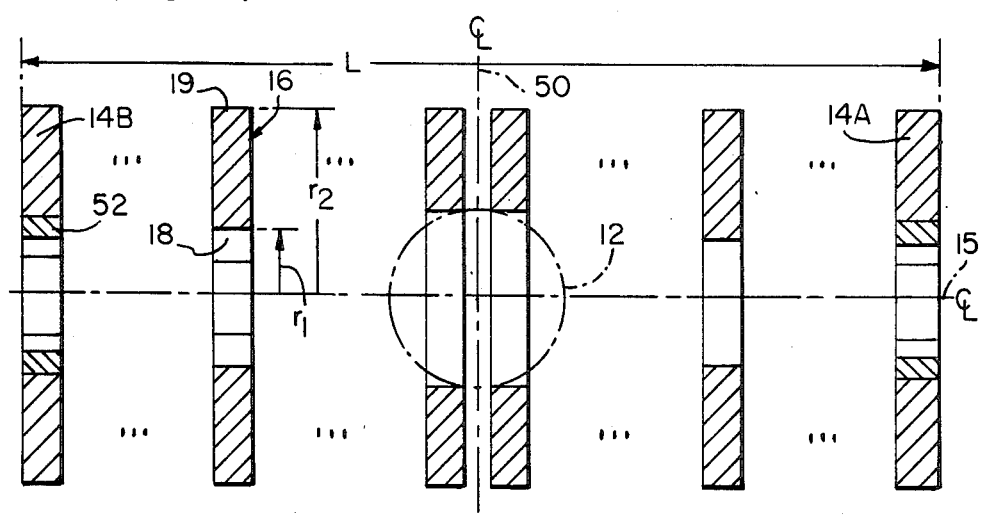
FIG. 4 is a schematic representation of the ring assembly shown in FIGS. 1 and 2 for the purpose of illustrating the variation in the radial positions of the segments as a function of the extent of the assembly.

As shown in FIG. 1, each ring 14 is octagonal in shape, and is formed of nonmagnetic material such as aluminum. Physically, the dimension across the flats of an octagonally shaped ring 14 is about two meters, and the material of the ring is bar-stock about $10\times10$ cm. Within each of the rings is a plurality of discrete, permanent magnet segments 16 arranged angularly within the ring for defining a central, coaxial aperture 17. Thus, as shown in FIG. 1, the magnetic segments 16 are trapezoidal in shape having inner and outer free ends 18 and 19, respectively. The segments are mounted in a manner described below; and as a result, the inner and outer free ends 18 and 19 are located at distances $r_1$ and $r_2$, respectively (see FIG. 4) from axis 15 of the ring within which the segments are mounted. As shown in FIG. 1, the inner free ends 18 of the segments of the rings define a central aperture 17 of length L within the ring assembly. For reference purposes, $r_2-r_1$ is about 60 cm.

Segments 16 are formed of a permanent magnet material such as ferrite because this material is considerably less expensive than rare earth cobalt material. However, if cost is not a consideration, segments 16 would be fashioned from rare earth cobalt, neodymium-boron-iron, mischmetall, or may other high coercivity magnetic material.

Each segment 16 has an easy axis of magnetization, the orientation of which is functionally related to the angular position of the segment in the ring. Thus, as shown in FIG. 1, segment 20 is located at an angle of 0° with respect to the coordinate system x,y. Following the teachings in Reference [1], the easy axis of magnetization of segment 20 is at 0° which is illustrated by arrow 21. On the other hand, segment 22, which is located at +45° relative to the x-axis has an easy axis of magnetization at an angle of 90° relative to the x axis. Consequently, segment 22 is magnetized in the direction of arrow 23. In a similar manner, the direction the easy axis of magnetization varies from segment to segment in the manner shown in FIG. 1. The result is that the segments produce, within aperture 17, a substantially uniform dipole field whose direction is suggested by arrow 24.

The segments are configured so that spaces exist between adjacent segments as indicated in FIG. 1. Using the analysis contained in Reference [1], the size of segments 16 and the spacing therebetween are selected such that the fundamental spatial frequency associated with the eight segments in a ring is substantially removed and the magnetic field within aperture 17 of a given field due only to the segments of the field is substantially uniform.

A plurality of rings are positioned side-by-side as shown in FIG. 2. At the present time, it is contemplated that 16 rings would be fitted together and held in place by tie bars 25 attached to the outer periphery of the rings as shown in FIGS. 1 and 2. A plurality of upright supports 26 attached to rings 14, as well as longitudinal beams 27 rigidly hold the rings in a fixed position and support the entire assembly on surface 28.

Figure 3:
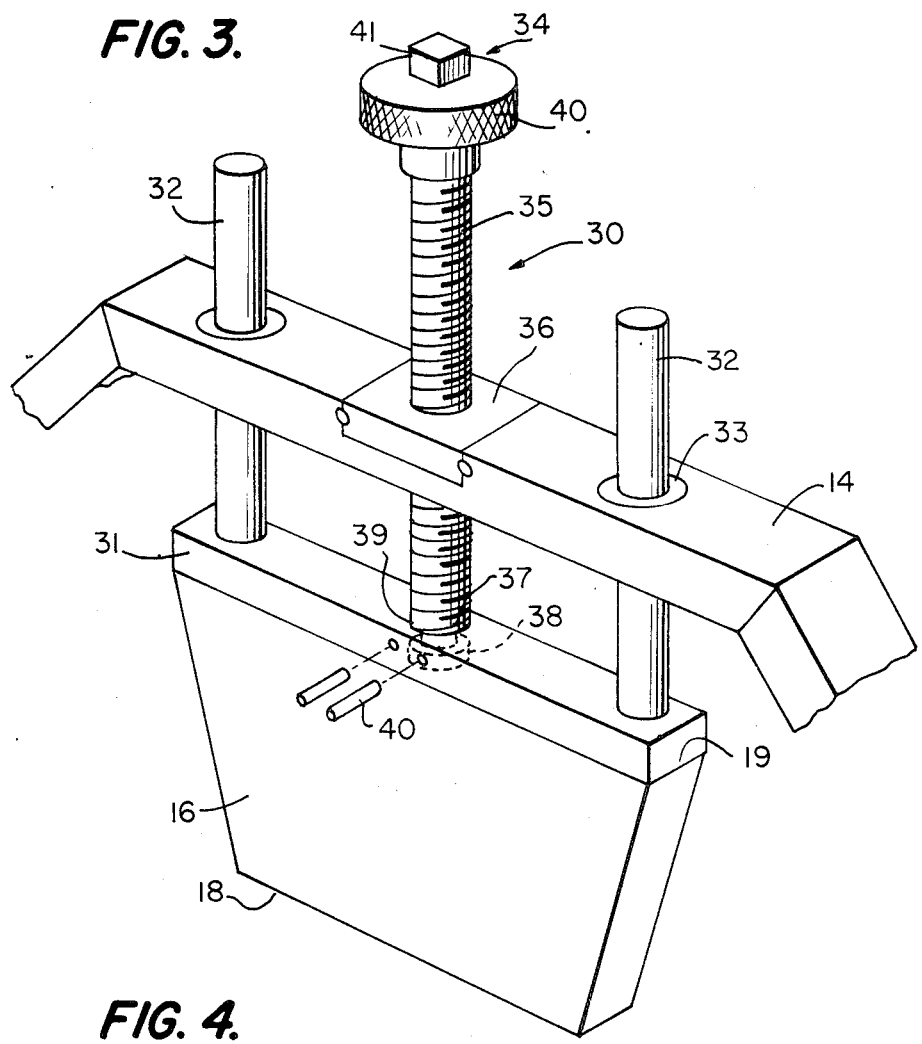
FIG. 3 is a perspective schematic view of a permanent magnetic segment showing the means by which the segment is radially adjustable relative to the ring in which it is mounted.

The present invention provides means for moveably mounting the segments in each ring such that the distances of each segment are non-uniformly, but functionally related to the axial extent L of the assembly. Specifically, the means mounting the segments in each ring permits independent radial adjustment of the segments. The matter of achieving this is shown best in FIG. 3 to which reference is now made.

Means 30, for effecting independent radial adjustment of the segments of a ring, includes nonmagnetic bar 31 bonded to free end 19 of segment 16. Rigidly attached to bar 31 are a pair of guide rods 32 that project through guide bushings 33 mounted in ring 14. Rods 32 and bushings 33 cooperate to define guide means for effecting radial displacement of segment 16 relative to ring 14.

In order to establish and maintain the radial position of segment 16 in rings 14, means 34 are provided for adjusting the radial position of the segment. Means 34 comprises threaded rod 35 which passes through nut 36 that is rigidly attached to ring 14 such that rotation of rod 35 causes it to move inwardly or outwardly in a radial direction with respect to ring 14. One end of threaded rod 35 has reduced portion 37 that terminates in enlarged head 38 at the free end thereof. Enlarged head 38 fits into mating hole 39 in bar 31 and is captured behind retaining pins 40 that fit closely adjacent reduced portion 37. As a consequence, threaded rod 35 can rotate relative to bar 31 and thus move the bar and the segment attached thereto inwardly or outwardly relative to ring 14. To facilitate rotation of threaded rod 35, knob 40 and square head 41, for receiving a wrench, are provided at the free end of the rod opposite head 38.

The present invention contemplates that each ring, except end rings 14a, 14b at the axial ends of apparatus 11, is identical. That is to say, each of rings 14 intermediate axial end rings 14a and 14b is constructed such that segments 16 of a ring can move inwardly or outwardly relative to axis 15. For reasons of economy and as pointed out below, the rings adjacent center 50 of apparatus 11 need not have the adjustable feature shown in FIG. 3. The four rings on each side of center 50 essentially define imaging sphere 12 which has a radius of about 20 cm. The remainder of the rings, including the end rings, are provided for the purpose of ensuring that the magnetic field within imaging sphere 12 is as uniform as possible.

Uniformity is achieved by permitting the segments of the remainder of the rings to be adjusted in the manner described below. In addition, axial end rings 14a and 14b are somewhat different than the intermediate rings. Specifically, the segments in the axial end rings are made somewhat larger, in a radial direction, so that the aperture defined by free ends 18 of the segments is smaller at the axial ends than the aperture adjacent to center 50. For economy reasons, segments 16 are made identical; and, smaller portions are bonded to the segments contained in axial end rings 14a and 14b. For example, 10 cm. extensions 52 may be provided on each segment 16 in the axial end rings whose radial dimension would be about 70 cm. this design reduces the leakage of magnetic field outside assembly 11.

In using the present invention, an analytical procedure may be followed based on the disclosure in Reference [1] for the purpose of optimizing the radial positions of each segment in the various rings which make up assembly 11. That is to say, the radial positions of the segments in each ring can be computed assuming that perfect magnetic material is utilized, and that the spacing between segments in a ring is such that the fundamental spatial frequency of the dipole field is eliminated. Field strength measurements within the imaging sphere are then carried out to map the distortion in the dipole field. Segments in rings between the centrally located rings and the axial rings are then adjusted radially; and field strength measurements in the imaging sphere are repeated. The process is repeated, iteratively, until the distortions in the field are reduced to the desired level.

What is claimed is:

1. In an NMR imaging system, apparatus for producing a homogeneous transverse magnetic field in a predetermined volume comprising:
   (a) a ring assembly having an axial extent L defined by a plurality of non-magnetic rings, each having an axis and positioned side-by-side so that axis of the rings are colinear and define the axis of the ring assembly;
   (b) a plurality of discrete, permanent magnet segments angularly mounted within each ring for defining a central, coaxial aperture;
   (c) each segment in said each ring having the same angular position and the same easy axis of magnetization whose orientation is functionally related to the angular position of the segment in the ring;
   (d) each segment having inner and outer free ends that are nominally located at distances r1 and r2, respectively, from the axis of the ring within which it is mounted, the inner free ends of the segments of all the rings defining a central aperture of length L within said ring assembly; and
   (e) means for mounting the segments in said each ring such that the distances r1 and r2 of each segment are nonuniformly but functionally related to the axial extent L of the assembly so as to produce a homogeneous magnetic field transverse to the axis of the ring assembly.

2. Apparatus in accordance with claim 1 wherein said means mounting the segments in each ring includes means for effecting independent radial adjustment of the segments.

3. Apparatus in accordance with claim 2 wherein said means for affecting independent radial adjustment of the segments of a ring include, for each segment, guide means cooperable with the ring for effecting radial displacement of the segment relative to the ring, and means for adjusting the radial position of the segment on the ring.

4. Apparatus according to claim 3 wherein the means for adjusting radial position of the segment on the ring includes a screw thread.

5. Apparatus in accordance with claim 1 wherein the quantity $r_2 - r_1$ on each ring is a constant for all rings between the two rings that form the end ring of the assembly.

6. Apparatus according to claim 5 wherein the quantity $r_2 - r_1$ of the end rings differs from the quantity $r_2 - r_1$ for the rings intermediate the end rings.

7. Apparatus in accordance with claim 6 wherein the quantity $\ln(r2/r1)$ of the end rings is greater than the quantity $\ln(r2/r1)$ of the rings intermediate the end rings.

8. Apparatus according to claim 7 wherein the functional relationship between the easy access of magnetization of a segment and its angular position $\theta$ on a ring is $2\theta$.

9. A method for controlling the uniformity within an imaging sphere of an NMR imaging system having a ring assembly defined by a plurality of nonmagnetic rings positioned side-by-side, and each having a plurality of discrete permanent segments angularly mounted there within, each segment in a ring having an easy axis of magnetization whose orientation is twice the angular position of the segment on the ring and having inner and outer free ends that are normally located at distances $r_1$ and $r_2$, respectively, from the axis that a ring within which it is mounted, the inner free ends of the segments of all of the rings defining a central aperture of axial extent L within said ring assembly whereby the apertures of centrally located rings establish an imaging sphere; said method comprising steps of:
  (a) positioning said segments on said rings at selective radial positions;
  (b) measuring the field strength distribution in said imaging sphere; and
  (c) adjusting the radial position of the segments in rings other than said centrally located rings for minimizing spatial differences in field strength within said imaging sphere.

10. A method according to claim 9 wherein the position of said segments on said rings is selected in accordance with a model in which the permeability of said magnetic material is unity and the easy axis of magnetization of the segment in a ring varies continuously as a function of angular position in a ring.

* * * * *